(12) United States Patent
Cheng et al.

(10) Patent No.: US 11,374,131 B2
(45) Date of Patent: Jun. 28, 2022

(54) THIN FILM TRANSISTOR AND METHOD FOR MANUFACTURING THE SAME, ARRAY SUBSTRATE AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Hongfei Cheng, Beijing (CN); Chen Xu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 149 days.

(21) Appl. No.: 16/635,140

(22) PCT Filed: Aug. 1, 2019

(86) PCT No.: PCT/CN2019/098856
§ 371 (c)(1),
(2) Date: Jan. 29, 2020

(87) PCT Pub. No.: WO2020/088020
PCT Pub. Date: May 7, 2020

(65) Prior Publication Data
US 2021/0217899 A1    Jul. 15, 2021

(30) Foreign Application Priority Data
Oct. 29, 2018  (CN) .......................... 201811267077.X

(51) Int. Cl.
*H01L 29/786* (2006.01)
*H01L 27/12* (2006.01)
(Continued)

(52) U.S. Cl.
CPC .... *H01L 29/78696* (2013.01); *H01L 27/1222* (2013.01); *H01L 27/1274* (2013.01);
(Continued)

(58) Field of Classification Search
CPC .......................... H01L 29/6675–66765; H01L 29/78663–78678; H01L 29/78696; H01L 27/1229–1285
See application file for complete search history.

(56) References Cited

U.S. PATENT DOCUMENTS

| | | | |
|---|---|---|---|
| 10,310,347 B2 | 6/2019 | Ishida et al. | |
| 2014/0138690 A1 | 5/2014 | Ota et al. | |

(Continued)

FOREIGN PATENT DOCUMENTS

| | | |
|---|---|---|
| CN | 103258855 A | 8/2013 |
| CN | 105789327 A | 7/2016 |

(Continued)

OTHER PUBLICATIONS

International Search Report dated Sep. 26, 2019, received for corresponding PCT Chinese Application No. PCT/CN2019/098856, 13 pages.

(Continued)

*Primary Examiner* — Brigitte A Paterson
*Assistant Examiner* — Molly K Reida
(74) *Attorney, Agent, or Firm* — Kinney & Lange, P.A.

(57) ABSTRACT

A thin film transistor, an array substrate, a display device and a method for manufacturing a thin film transistor are provided. The thin film transistor is formed on a base substrate and includes a source; a drain; and a semiconductor active layer having an amorphous silicon layer and one polysilicon portion or a plurality of polysilicon portions, the amorphous silicon layer being contacted with the one polysilicon portion or the plurality of polysilicon portions. The method (Continued)

includes a process of forming a source, a drain, and a semiconductor active layer: wherein forming a semiconductor active layer comprises: forming a first amorphous silicon thin film on a base substrate; and performing a crystallization treatment to the first amorphous silicon thin film to convert a part of the amorphous silicon in the first amorphous silicon thin film into polysilicon, such that a semiconductor active layer comprising one polysilicon portion or a plurality of polysilicon portions are formed.

14 Claims, 14 Drawing Sheets

(51) Int. Cl.
    *H01L 29/45*       (2006.01)
    *H01L 29/66*       (2006.01)

(52) U.S. Cl.
    CPC ........ *H01L 29/45* (2013.01); *H01L 29/66757* (2013.01); *H01L 29/66765* (2013.01); *H01L 29/78666* (2013.01); *H01L 29/78669* (2013.01); *H01L 29/78675* (2013.01); *H01L 29/78678* (2013.01)

(56) References Cited

U.S. PATENT DOCUMENTS

| | | | |
|---|---|---|---|
| 2018/0122839 A1* | 5/2018 | Nodera | H01L 21/02678 |
| 2018/0190830 A1 | 7/2018 | Ren et al. | |
| 2018/0212065 A1 | 7/2018 | Matsushima et al. | |
| 2019/0157462 A1* | 5/2019 | Mizumura | H01L 29/78618 |

FOREIGN PATENT DOCUMENTS

| | | |
|---|---|---|
| CN | 106653861 A | 5/2017 |
| CN | 106663697 A | 5/2017 |
| CN | 107408578 A | 11/2017 |
| CN | 107533979 A | 1/2018 |
| CN | 108028030 A | 5/2018 |
| CN | 108028201 A | 5/2018 |
| JP | 0897431 A | 4/1996 |

OTHER PUBLICATIONS

First Chinese Office Action dated Mar. 13, 2020, received for corresponding Chinese Application No. 201811267077.X, 15 pages.

* cited by examiner

THIN FILM TRANSISTOR AND METHOD FOR MANUFACTURING THE SAME, ARRAY SUBSTRATE AND DISPLAY DEVICE

CROSS-REFERENCE TO RELATED APPLICATION(S)

The present application is the national phase of PCT Application No. PCT/CN2019/098856 filed on Aug. 1, 2019, which in turn claims the benefit of Chinese Patent Application No. 201811267077.x filed on Oct. 29, 2018 in the State Intellectual Property Office of China, the whole disclosure of which is incorporated herein by reference.

TECHNICAL FIELD

The present disclosure relates to the field of display technology, and in particular, to a thin film transistor and a method for manufacturing the same, an array substrate, and a display device.

BACKGROUND

With a development of liquid crystal display technology, requirements to the electron mobility of thin film transistors (TFT for short) are getting higher and higher. Low Temperature Poly-silicon Thin Film Transistor (LTPS TFT for short) came into being.

A performance of the low temperature polysilicon thin film transistors of related art is to be improved.

SUMMARY

According to an aspect of the present disclosure, there is provided a thin film transistor formed on a base substrate, the thin film transistor comprising: a source; a drain; and a semiconductor active layer having an amorphous silicon layer and one polysilicon portion or a plurality of polysilicon portions, the amorphous silicon layer being contacted with the one polysilicon portion or the plurality of polysilicon portions.

In an embodiment of the present disclosure, the one polysilicon portion is a strip-shaped structure extending in a direction toward the source and the drain.

In an embodiment of the present disclosure, the plurality of polysilicon portions are strip-shaped structures, which extend in a direction toward the source and the drain and which are alternately distributed.

In an embodiment of the present disclosure, the plurality of polysilicon portions in stripe-shaped structures are arranged to be parallel to each other.

In an embodiment of the present disclosure, the plurality of polysilicon portions in stripe-shaped structures are arranged to have a same length, and both ends of the plurality of polysilicon portions are aligned with each other respectively.

In an embodiment of the present disclosure, the plurality of polysilicon portions in stripe-shaped structures are oblong or rectangular with a same shape.

In an embodiment of the present disclosure, the number of the plurality of polysilicon portions is at least three.

In an embodiment of the present disclosure, the amorphous silicon layer comprises one hollow portion or a plurality of hollow portions, and the one polysilicon portion or the plurality of polysilicon portions respectively fill the one hollow portion or the plurality of hollow portions to form a first sub-semiconductor layer.

In an embodiment of the present disclosure, the semiconductor active layer further comprises a second sub-semiconductor layer formed of another amorphous silicon layer, and the second sub-semiconductor layer is disposed on the first sub-semiconductor layer and is arranged to cover the first sub-semiconductor layer, and the source and the drain are connected to the second sub-semiconductor layer.

In an embodiment of the present disclosure, there is no overlapping area between orthographic projections of the source and the drain on the base substrate and orthographic projection(s) of the one polysilicon portion or the plurality of polysilicon portions on the base substrate.

In an embodiment of the present disclosure, an ohmic contact layer is disposed between the source and the amorphous silicon layer, and the ohmic contact layer is disposed between the drain and the amorphous silicon layer.

In an embodiment of the present disclosure, the second sub-semiconductor layer is disposed on the first sub-semiconductor layer and is arranged to cover the first sub-semiconductor layer.

In an embodiment of the present disclosure, the thin film transistor is a bottom gate type thin film transistor or a top gate type thin film transistor.

According to another aspect of the present disclosure, there is provided an array substrate comprising: a base substrate; and a plurality of thin film transistors, at least one thin film transistor of the plurality of thin film transistors is the thin film transistor mentioned above.

According to another aspect of the present disclosure, there is provided a display device comprising an array substrate, wherein the array substrate comprises: a base substrate; and a plurality of thin film transistors, at least one thin film transistor of the plurality of thin film transistors is the thin film transistor mentioned above.

According to yet another aspect of the present disclosure, there is provided a method for manufacturing a thin film transistor, the method comprising a process of forming a source, a drain, and a semiconductor active layer: wherein forming a semiconductor active layer comprises: forming a first amorphous silicon thin film on a base substrate; and performing a crystallization treatment to the first amorphous silicon thin film to convert a part of the amorphous silicon in the first amorphous silicon thin film into polysilicon, such that a semiconductor active layer comprising one polysilicon portion or a plurality of polysilicon portions are formed.

In an embodiment of the present disclosure, the method further comprises configuring a shape of the one polysilicon portion or the plurality of polysilicon portions into a strip-like structure extending in a direction toward the source and the drain.

In an embodiment of the present disclosure, the method further comprises forming a semiconductor active layer with the one polysilicon portion or the plurality of polysilicon portions further comprises: forming a second amorphous silicon thin film on the first amorphous silicon thin film; and performing a patterning process on the second amorphous silicon thin film to form a second sub-semiconductor layer, wherein an orthographic projection of the second sub-semiconductor layer on the base substrate covers orthographic projection(s) of the one polysilicon portion or the plurality of polysilicon portions on the base substrate.

In an embodiment of the present disclosure, the method further comprises arranging the plurality of polysilicon portions in stripe-shaped structures to be in parallel to each other and to be spaced apart from each other.

In an embodiment of the present disclosure, the method further comprises arranging the plurality of polysilicon portions in stripe-shaped structures to have a same length, and arranging both ends of the plurality of polysilicon portions to be aligned with each other respectively.

BRIEF DESCRIPTION OF THE DRAWINGS

Other objects and advantages of the present disclosure will be apparent from the following description of the present disclosure with reference to the accompanying drawings, and may help a comprehensive understanding of the present disclosure.

Figure 1:
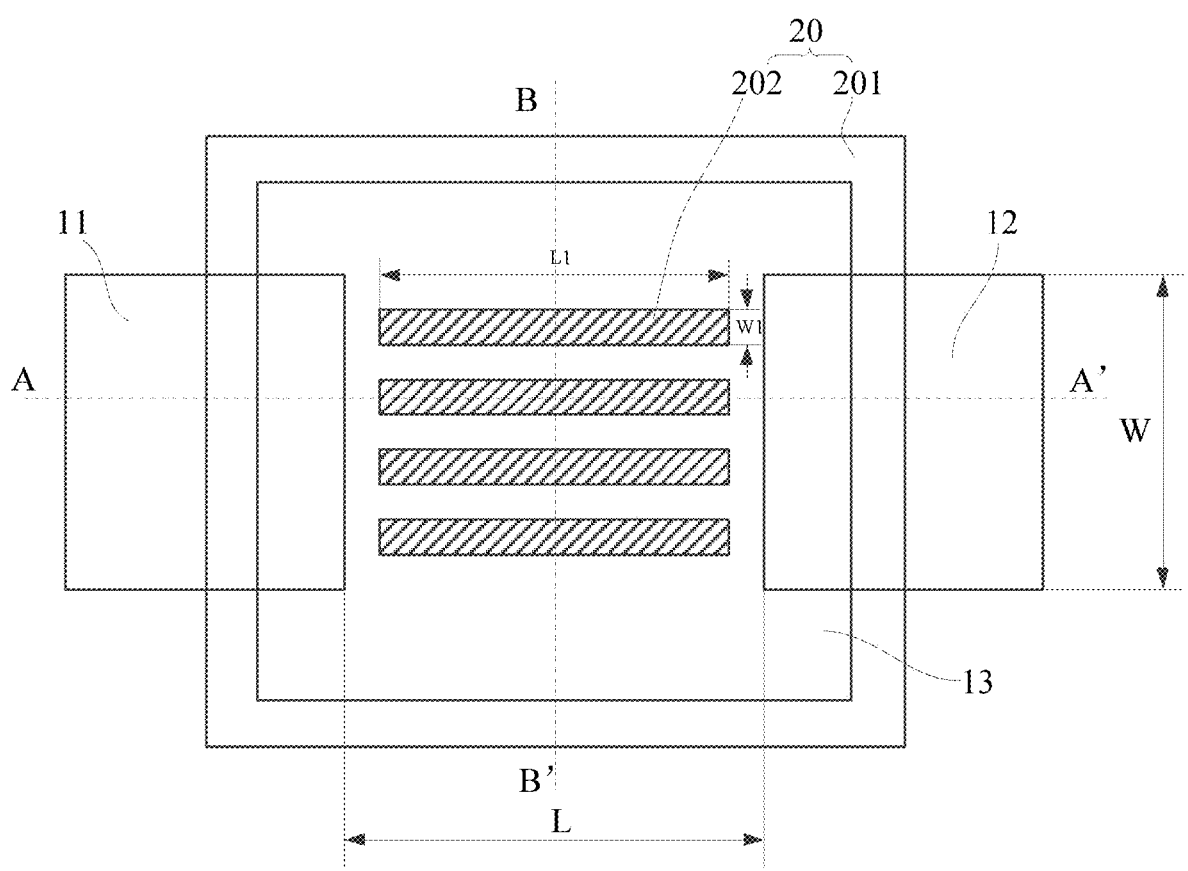
FIG. 1 is a plan view of a thin film transistor according to an embodiment of the present disclosure, wherein the thin film transistor is a bottom gate type thin film transistor.

It should be noted that, for the sake of clarity, the dimension(s) of layer(s), structure(s) or region(s) may be enlarged or reduced in the drawings for describing the embodiments of the present disclosure, that is, these drawings are only schematic and are not necessarily drawn according to the actual scale.

DETAILED DESCRIPTION OF EMBODIMENTS

The technical solutions of the present disclosure will be further specifically described through the embodiments and the accompanying drawings. In the description, the same or similar reference numerals indicate the same or similar components/elements. The following description of the embodiments of the present disclosure with reference to the drawings is intended to explain the general inventive concept of the present disclosure, and should not be construed as a limitation to the present disclosure.

In addition, in the following detailed description, for ease of explanation, many specific details are set forth to provide a comprehensive understanding to the embodiments of the present disclosure. Obviously, however, one or more embodiments may be implemented without these specific details.

Figure 2:
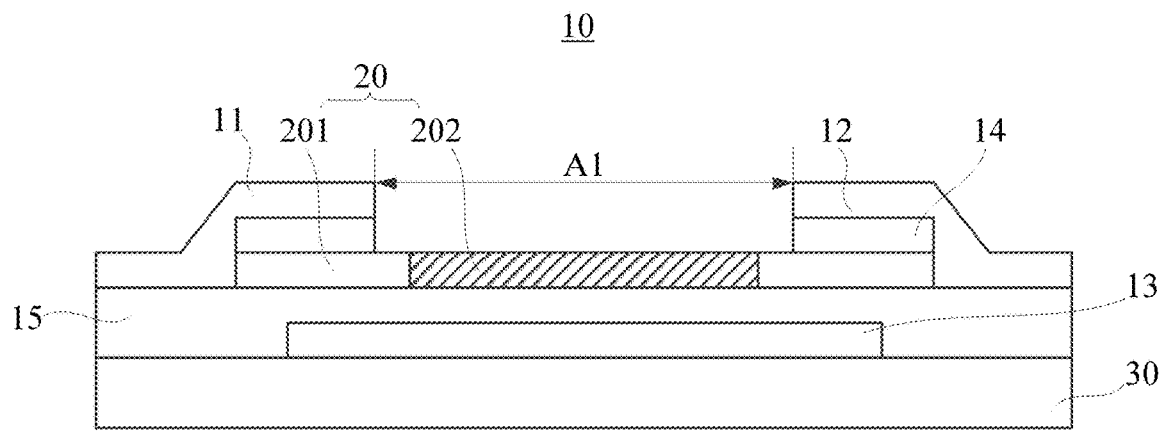
FIG. 2 is a cross-sectional view of a thin film transistor taken along a line AA' in FIG. 1 according to an embodiment of the present disclosure.
Figure 3:
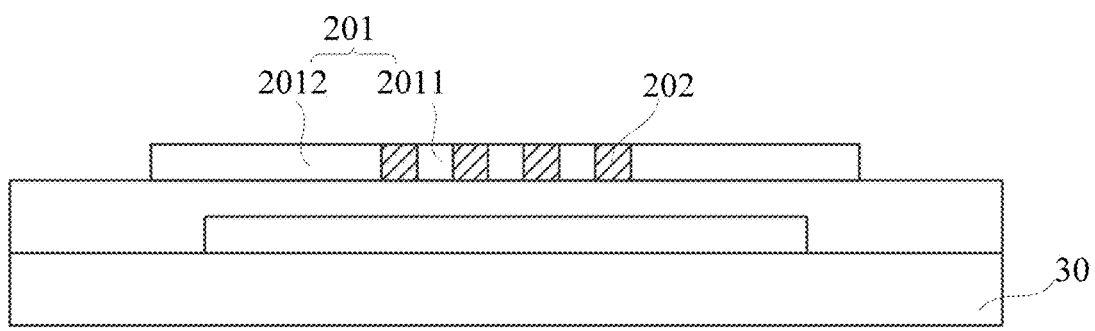
FIG. 3 is a cross-sectional view of a thin film transistor taken along a line BB' in FIG. 1 according to an embodiment of the present disclosure.

FIG. 1 is a plan view of a thin film transistor according to an embodiment of the present disclosure; FIG. 2 is a cross-sectional view of a thin film transistor taken along a line AA' in FIG. 1 according to an embodiment of the present disclosure; and FIG. 3 is a cross-sectional view of a thin film transistor taken along a line BB' in FIG. 1 according to an embodiment of the present disclosure. It should be noted that FIG. 1 is only schematic in order to clearly show the positional relationship among the gate, the semiconductor active layer, the source and the drain. As shown in FIGS. 1-3, the thin film transistor 10 according to an embodiment of the present disclosure may be formed on a base substrate 30. The thin film transistor 10 may include a source 11, a drain 12, a gate 13, and a semiconductor active layer 20.

It can be understood that the region between the source and the drain of the semiconductor active layer, that is, the region indicated by the reference sign A1 in FIG. 2, may be referred to as a channel formed after the thin film transistor is turned on. As shown in FIG. 1, the length L of the channel A1 is the distance between the source 11 and the drain 12, and the width W of the channel A1 is the width of the overlapping portion of the source 11 or the drain 12 with the semiconductor active layer 20. The width is a width W perpendicular to the length L.

As shown in the figures, the semiconductor active layer 20 includes an amorphous silicon layer 201 having a polysilicon portion 202. The amorphous silicon layer 201 is composed of amorphous silicon, and the polysilicon portion 202 is composed of polysilicon. In the illustrated embodiment, the polysilicon portion 202 is entirely located in a region between the source 11 and the drain 12, that is, entirely in the channel A1. In other embodiments, at least a portion of the polysilicon portion 202 is located in a region between the source 11 and the drain 12, that is, it may be partially located in the channel A1.

In this embodiment, the semiconductor active layer includes both polysilicon and amorphous silicon. When the thin film transistor is in an on state, the speed of electron movement between the source and drain increases under an influence of the polysilicon with high mobility, thereby the on-state current being relatively large; at the same time, when the thin film transistor is in an off state, the resistivity between the source and the drain increases under an influence of the amorphous silicon with low mobility, thereby reducing the moving speed of the electrons between the source and drain and then reducing the leakage current.

Optionally, the semiconductor active layer 20 includes a plurality of polysilicon portions 202. In the illustrated embodiment, the semiconductor active layer 20 includes four polysilicon portions 202. In other embodiments, the semiconductor active layer 20 may include 3 polysilicon portions 202, or the semiconductor active layer 20 may include 5 or more polysilicon portions 202. In an embodiment of the present disclosure, the semiconductor active layer 20 includes 3 or more polysilicon portions 202. In the illustrated embodiment, each of the polysilicon portions 202 is entirely located in a region between the source 11 and the drain 12, that is, completely located in the channel A1. In other embodiments, at least a portion of each polysilicon portions 202 is located in a region between the source 11 and the drain 12, that is, may be partially located in the channel A1. Three or more polysilicon portions are provided in the semiconductor active layer of the thin film transistor. When the thin film transistor is turned on, each polysilicon portion constitutes a conduction path for carriers such as electrons, and the carriers can move from the source to the drain by passing through a plurality of conduction paths formed by the polysilicon, which can ensure that the mobility of the carrier is high, so that the on-state current of the thin film transistor is large.

The amorphous silicon layer 201 includes one or more hollow portions, and the one or more polysilicon portions 202 respectively fill the one or more hollow portions to form a first sub-semiconductor layer.

As shown in FIG. 1, the size (length) L1 of each polysilicon portion 202 in the length direction (L direction) of the channel of the thin film transistor is greater than the size (width) W1 of the polysilicon portion 202 in the width direction (W direction) of the channel of the thin film transistor. For example, for a polysilicon portion 202, the ratio of the length L1 to the width W1 may be greater than or equal to 2:1, for example, 3:1, 5:1, 10:1, and so on. By setting the length of each polysilicon portion to be greater than the width of the polysilicon portion, in particular, by designing the ratio of the length to the width of each polysilicon portion to be greater than or equal to 2:1, it is possible to achieve that sufficient polysilicon portions are set in the width direction of the channel of the thin film transistor. For example, three or more polysilicon portions are provided in the width direction of the channel of the thin film transistor, thereby ensuring that the on-state current of the thin film transistor is large.

Figure 4:
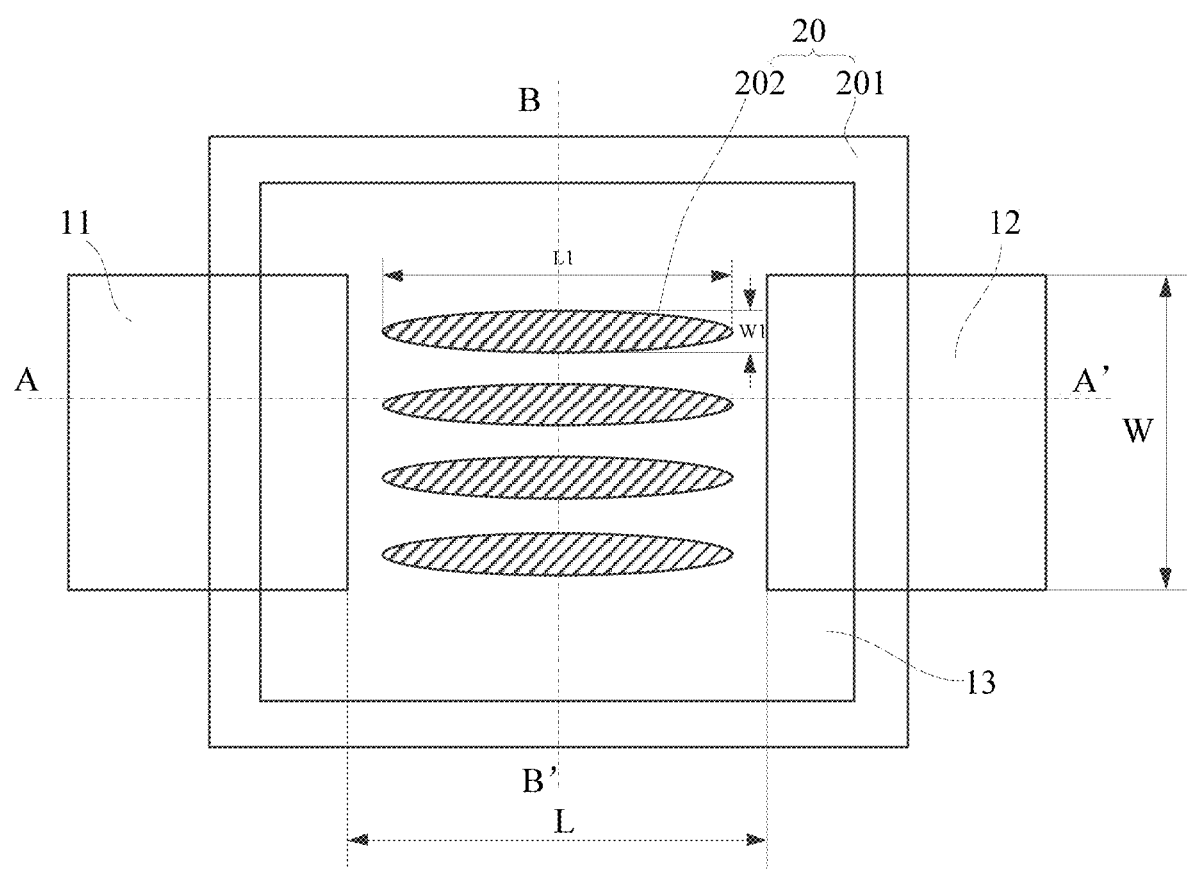
FIG. 4 is a plan view of a thin film transistor according to an embodiment of the present disclosure, in which an orthographic projection of a polysilicon portion on the base substrate is elliptical.

As shown in FIG. 1, each of the polysilicon portions 202 is a strip-shaped structure extending in a direction toward the source and the drain, the orthographic projection of which on the substrate 30 is rectangular. The long sides of the rectangle are parallel to the length direction of the channel, while the short sides of the rectangle are parallel to the width direction of the channel. Optionally, as shown in FIG. 4, the orthographic projection of each poly silicon portion 202 on the base substrate 30 may be an ellipse, the long axis of the ellipse is parallel to the length direction of the channel, and the short axis of the ellipse is parallel to the width direction of the channel. Alternatively, the orthographic projection of each polysilicon portion 202 on the base substrate 30 may be a rounded rectangle, the long sides of the rounded rectangle are parallel to the length direction of the channel, and the short sides of the rounded rectangle are parallel to the width direction of the channel. In this way, it is beneficial to form a plurality of polysilicon portions through a patterning process, which is convenient for manufacturing a thin film transistor.

In the embodiment of the present disclosure, the semiconductor active layer of the thin film transistor includes a plurality of polysilicon portions in stripe-shaped structures, and each polysilicon portion in stripe-shaped structure extends in a length direction of the channel. When the thin film transistor is turned on, the carriers such as electronic can be moved from the source to the drain through the plurality of polysilicon portions in stripe-shaped structures, which can ensure that the mobility of the carriers is high, thereby making the on-state current of the thin film transistor larger. For example, the semiconductor active layer of the thin film transistor includes three or more polysilicon portions spaced apart in the width direction of the channel, which can make the on-state current of the thin film transistor larger.

Figure 6:
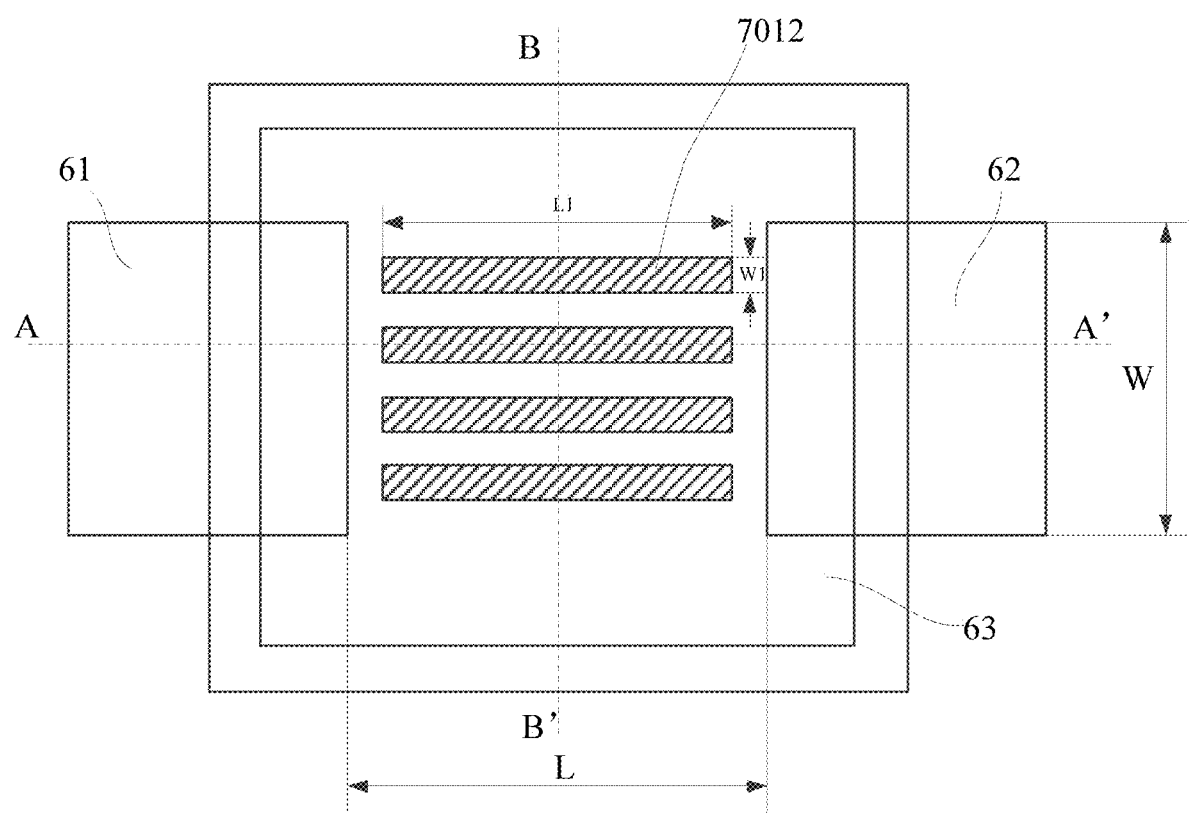
FIG. 6 is a plan view of a thin film transistor according to another embodiment of the present disclosure, wherein the thin film transistor is a bottom gate type thin film transistor, and wherein a semiconductor active layer includes a first sub-semiconductor layer and a second sub-semiconductor layer.

Optionally, the length L1 of each polysilicon portion 202 in the length direction (L direction) of the channel of the thin film transistor is less than the distance between the source 11 and the drain 12, that is, less than the length L of the channel A1. The width W1 of each polysilicon portion 202 in the width direction (W direction) of the channel of the thin film transistor is smaller than the width W of the channel A1, and the sum of the widths W1 of the plurality of polysilicon portions 202 in the width direction (W direction) of the channel of the thin film transistor is smaller than the width W of the channel A1, so that the plurality of polysilicon portions 202 may be spaced apart in the width direction of the channel of the thin film transistor. As shown in FIGS. 1, 4 and 6, the plurality of polysilicon portions 202 and 7012 have the same shape and are arranged in parallel and spaced apart from each other.

As shown in FIG. 1 and FIG. 3, the plurality of polysilicon portions 202 are distributed at intervals in the width direction of the channel of the thin film transistor. In the illustrated embodiment, four poly silicon portions 202 are distributed between the source 11 and the drain 12 at intervals in the width direction of the channel of the thin film transistor. For example, the four polysilicon portions 202 are uniformly distributed in the width direction of the channel of the thin film transistor, and every two adjacent polysilicon portions 202 are equally spaced apart.

In this embodiment, the amorphous silicon layer 201 may include a first amorphous silicon sub-portion 2011 and a second amorphous silicon sub-portion 2012. As shown in FIG. 3, the first amorphous silicon sub-portion 2011 is located between a plurality of polysilicon portions 202 spaced apart from each other, while the second amorphous silicon sub-portion 2012 is located outside the plurality of poly silicon portions 202 distributed at intervals.

For example, as shown in the figure, there is no overlapping area between the orthographic projections of the plurality of polysilicon portions 202 on the base substrate 30 and the orthographic projections of the source 11 and drains 12 on the base substrate 30, that is, the orthographic projection of each of the poly silicon portions 202 on the base substrate 30 does not overlap the orthographic projection of the source 11 and the drain 12 on the base substrate 30. The orthographic projections of the plurality of polysilicon portions 202 on the base substrate 30 completely fall within the orthographic projection of the channel A1 on the base substrate 30. Specifically, the orthographic projection of the second amorphous silicon sub-portion 2012 on the base substrate 30 and the orthographic projections of the source 11 and the drain 12 on the base substrate 30 at least partially overlap to each other. In this manner, the polysilicon portion 202 is not in direct contact with the source 11 and the drain 12, while the amorphous silicon layer 201 is in direct contact with the source 11 and the drain 12.

After research, it is found that in the related art, the polysilicon thin film transistor will have a self-heating effect. Specifically, the polysilicon thin film transistor has a SOI (abbreviation of Silicon On Insulator) structure and silicon dioxide has a low thermal conductivity. Therefore, the power heat generated by the thin film transistor during its operation cannot be effectively conducted away through the silicon dioxide substrate, causing the temperature of the device including the thin film transistor to rise. In the embodiment of the present disclosure, the semiconductor active layer of the thin film transistor includes an amorphous silicon layer and a plurality of polysilicon portions distributed at intervals therein, which can reduce the power heat generated during the operation of the thin film transistor.

Optionally, the thin film transistor 10 may further include an ohmic contact layer 14. For example, the ohmic contact layer 14 may be disposed between the source 11 and the semiconductor active layer 20, and disposed between the drain 12 and the semiconductor active layer 20. The source 11 is in contact with the amorphous silicon layer of the semiconductor active layer 20 through the ohmic contact layer 14, and the source 12 is in contact with the amorphous silicon layer of the semiconductor active layer 20 through the ohmic contact layer 14. For example, the ohmic contact layer 14 may include ion-doped amorphous silicon, for example, it may be an amorphous silicon layer doped with phosphorus ions, or an amorphous silicon layer doped with boron ions. By provision of the ohmic contact layer, the contact resistance between the source 11 and the semiconductor active layer 20 and between the drain 12 and the semiconductor active layer 20 can be reduced.

In the embodiment shown in FIGS. 1-4, the thin film transistor 10 is a bottom gate type thin film transistor. As shown, the gate 13 is formed on the base substrate 30, the semiconductor active layer 20 is located on the gate 13, and the source 11 and the drain 12 are located on the semiconductor active layer 20. The thin film transistor 10 may further include a gate insulating layer 15, which is located between the gate 13 and the semiconductor active layer 20 and covers the gate 13. For example, the material of the gate insulating layer 15 may include silicon nitride or silicon oxide. As another example, the gate insulating layer 15 may have a single-layer structure or a multilayer structure, for example, it may include a silicon oxide layer and a silicon nitride layer.

Figure 5:
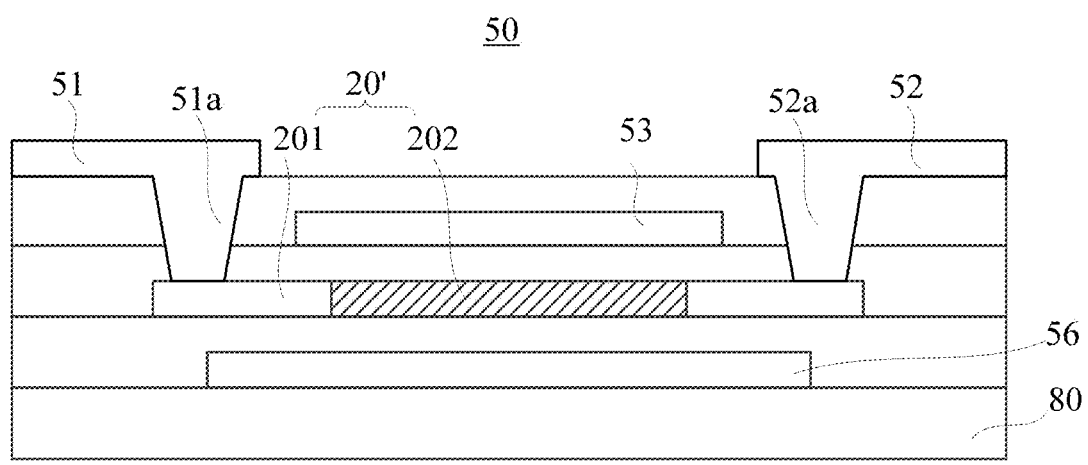
FIG. 5 is a schematic cross-sectional view of a thin film transistor according to an embodiment of the present disclosure, wherein the thin film transistor is a top gate type thin film transistor.

Optionally, the thin film transistor may also be a top gate type thin film transistor, as shown in FIG. 5. In the embodiment shown in FIG. 5, the thin film transistor 50 is formed on a base substrate 80 and may include a light shielding layer 56 formed on the base substrate, a semiconductor active layer 20' on the light shielding layer 56, and a gate 53 on the semiconductor active layer 20'. The source 51 and the drain 52 are connected to the semiconductor active layer 20' via connection portions 51a and 52a, respectively. For example, the structure of the semiconductor active layer 20'may be the same as the structure of the semiconductor active layer 20 described above. For example, the semiconductor active layer 20'may also include an amorphous silicon layer 201 having a plurality of polysilicon portions 202, the specific structure of which may be referred to the above description of the semiconductor active layer 20, details are not described herein again.

Figure 7:
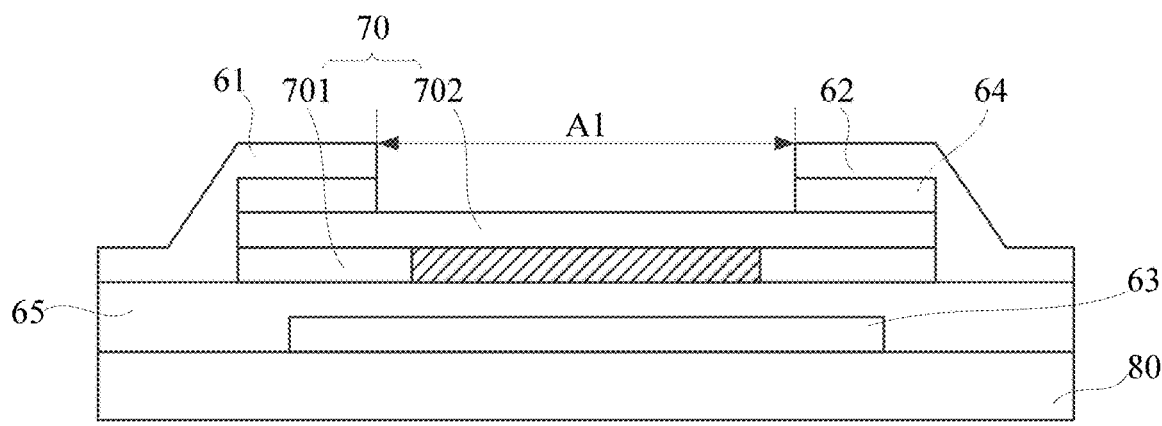
FIG. 7 is a cross-sectional view of a thin film transistor taken along line AA' in FIG. 6 according to another embodiment of the present disclosure.
Figure 8:
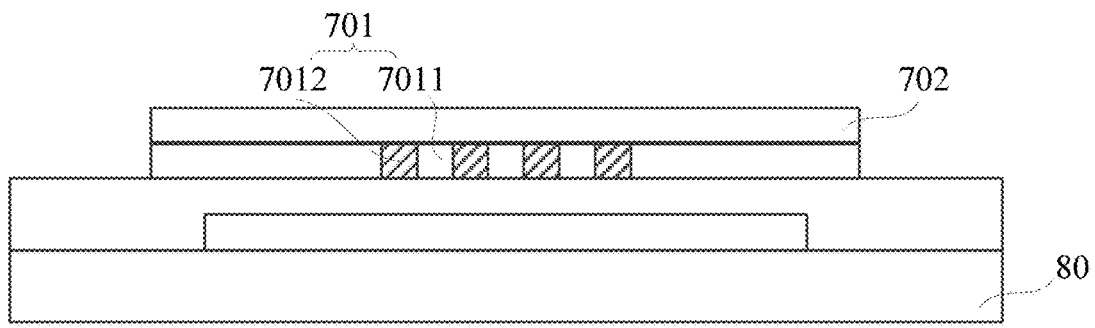
FIG. 8 is a cross-sectional view of a thin film transistor taken along a line BB' in FIG. 6 according to another embodiment of the present disclosure.

FIG. 6 is a plan view of a thin film transistor according to another embodiment of the present disclosure, wherein the thin film transistor is a bottom gate type thin film transistor, and wherein the semiconductor active layer includes a first sub-semiconductor layer and a second sub-semiconductor layer; FIG. 7 is a cross-sectional view of a thin film transistor taken along line AA' in FIG. 6 according to another embodiment of the present disclosure; FIG. 8 is a cross-sectional view of a thin film transistor taken along a line BB' in FIG. 6 according to another embodiment of the present disclosure. As shown in FIGS. 6-8, a thin film transistor 60 according to an embodiment of the present disclosure may be formed on a base substrate 80. The thin film transistor 60 may include a source 61, a drain 62, a gate 63, and a semiconductor active layer 70.

As shown in FIG. 7, the semiconductor active layer 70 may include a first sub-semiconductor layer 701 and a second sub-semiconductor layer 702. The second sub-semiconductor layer 702 is located between the first sub-semiconductor layer 701 and the source/drain layer in which the source 61 and the drain 62 are located.

As shown in FIG. 8, the first sub-semiconductor layer 701 may have the same structure as the semiconductor layer 20 described above. Specifically, the first sub-semiconductor layer 701 may include an amorphous silicon layer 7011 having a polysilicon portion 7012. The amorphous silicon layer 7011 is composed of amorphous silicon, and the polysilicon portion 7012 is composed of polysilicon. In the illustrated embodiment, the polysilicon portion 7012 is entirely located in a region between the source 61 and the drain 62, that is, completely in the channel A1. In other embodiments, at least a part of the polysilicon portion 7012 is located in a region between the source 61 and the drain 62, that is, it may be partially located in the channel A1.

Optionally, the first sub-semiconductor layer 701 includes a plurality of polysilicon portions 7012. In the illustrated embodiment, the first sub-semiconductor layer 701 includes four polysilicon portions 7012. In other embodiments, the first sub-semiconductor layer 701 may include 3 polysilicon portions 7012, or the first sub-semiconductor layer 701 may include 5 or more polysilicon portions 7012. In an embodiment of the present disclosure, the first sub-semiconductor layer 701 includes 3 or more polysilicon portions 7012. In the illustrated embodiment, each of the polysilicon portions 7012 is entirely located in a region between the source 61 and the drain 62, that is, completely located in the channel A1. In other embodiments, at least a part of each polysilicon portion 7012 is located in a region between the source 61 and the drain 62, that is, it may be partially located in the channel A1.

As shown in FIG. 6, the size (length) L1 of each polysilicon portion 7012 in the length direction (L direction) of the channel of the thin film transistor is larger than the size (width) W1 of the polysilicon portion 7012 in the width direction (W direction) of the channel of the thin film transistor. For example, for a polysilicon portion 7012, the ratio of the length L1 to the width W1 may be greater than or equal to 2:1, for example, 3:1, 5:1, 10:1, and so on.

As shown in FIG. 6, the orthographic projection of each polysilicon portion 7012 on the base substrate 80 is rectangular, the long sides of the rectangle are parallel to the length direction of the channel and the short sides of the rectangle are parallel to the width direction of the channel. Alternatively, similar to FIG. 4, the orthographic projection of each polysilicon portion on the base substrate may be an ellipse, the long axis of the ellipse is parallel to the length direction of the channel, and the short axis of the ellipse is parallel to the width direction of the channel.

Optionally, the length L1 of each polysilicon portion 7012 in the length direction (L direction) of the channel of the thin film transistor is less than the distance between the source 61 and the drain 62, that is, less than the length L of the channel A1. The width W1 of each polysilicon portion 7012 in the width direction (W direction) of the channel of the thin film transistor is smaller than the width W of the channel A1, and the sum of the widths W1 of the plurality of polysilicon portions 7012 in the width direction (W direction) of the channel of the thin film transistor is smaller than the width W of the channel A1 so that the plurality of poly silicon portions 202 may be spaced apart in the width direction of the channel of the thin film transistor.

As shown in FIG. 6 and FIG. 8, the plurality of polysilicon portions 7012 are distributed at intervals in the width direction of the channel of the thin film transistor. In the illustrated embodiment, four polysilicon portions 7012 are distributed between the source 61 and the drain 62 in the width direction of the channel of the thin film transistor. For example, the four poly silicon portions 7012 are uniformly distributed in the width direction of the channel of the thin film transistor, and every two adjacent polysilicon portions 7012 are equally spaced apart.

For other structures of the first sub-semiconductor layer 701, reference may be made to the above description of the semiconductor active layer 20, and details are not described herein again.

The second sub-semiconductor layer 702 may include an amorphous silicon material. For example, the second sub-semiconductor layer 702 is composed of an amorphous silicon material. For example, the second sub-semiconductor layer 702 is disposed on the first sub-semiconductor layer 701 and covers the first sub-semiconductor layer 701.

Optionally, the thin film transistor 60 may further include an ohmic contact layer 64. For example, the ohmic contact layer 64 may be disposed between the source 61 and the second sub-semiconductor layer 702, and disposed between the drain 62 and the second sub-semiconductor layer 702. The source 61 is in contact with the amorphous silicon layer of the second sub-semiconductor layer 702 through the ohmic contact layer 64, and the source 62 is in contact with the amorphous silicon layer of the second sub-semiconductor layer 702 through the ohmic contact layer 64. For example, the ohmic contact layer 64 may include ion-doped amorphous silicon, for example, it may be an amorphous silicon layer doped with phosphorus ions, or an amorphous silicon layer doped with boron ions. By provision of the ohmic contact layer, the contact resistance between the source 61 and the semiconductor active layer 70 and between the drain 62 and the semiconductor active layer 70 can be reduced.

In the embodiment shown in FIGS. 6-8, the thin film transistor 60 is a bottom gate type thin film transistor. As shown in the Figures, the gate 63 is formed on the base substrate 80, the semiconductor active layer 70 is located above the gate 63, and the source 61 and the drain 62 are located above the semiconductor active layer 70. The thin film transistor 60 may further include a gate insulating layer 65, which is located between the gate 63 and the semiconductor active layer 70 and covers the gate 63.

By contrast, in low temperature polysilicon thin film transistors of related art, an on-state current is increased in general by increasing the electron mobility between the source and the drain. When the low temperature polysilicon thin film transistor is in an off state, the leakage current will increase accordingly. Therefore, the low temperature polysilicon thin film transistor of the related art cannot simultaneously guarantee that the TFT has both a relatively large on-state current and a relatively small leakage current.

Optionally, the thin film transistor 60 may also be a top gate type thin film transistor, and description of its structure may refer to the description of FIG. 5, which is not repeated here.

Figure 9:
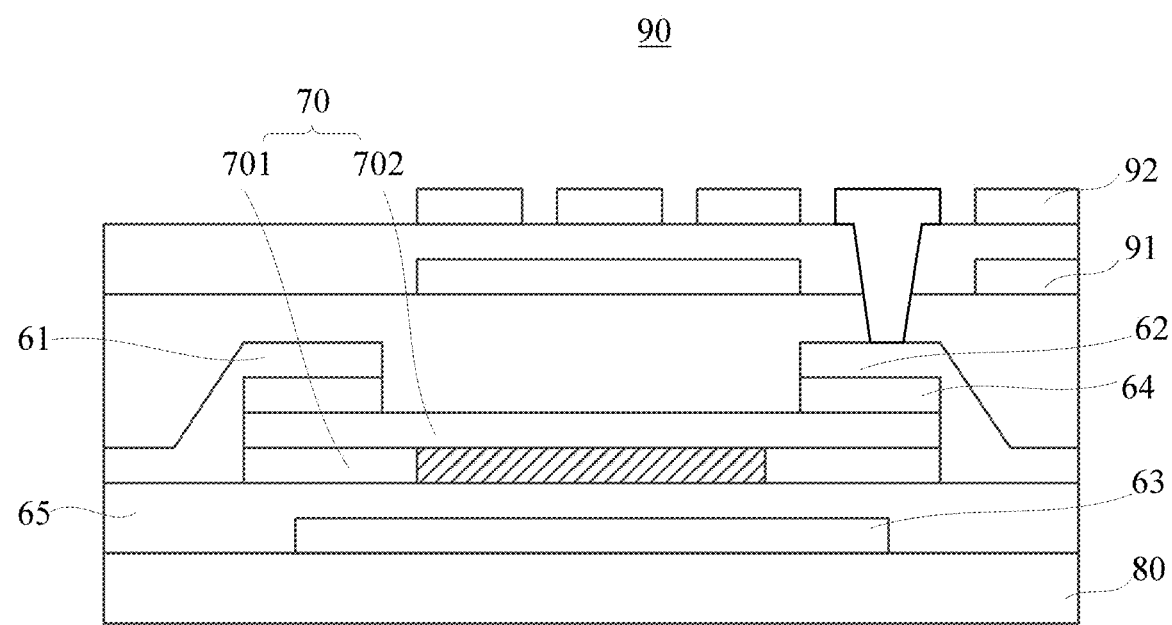
FIG. 9 is a schematic diagram of an array substrate according to an embodiment of the present disclosure.

Optionally, an embodiment of the present disclosure further provides an array substrate. For example, as shown in FIG. 9, the array substrate may be an advanced super-dimensional field switch (ADS for short) type array substrate 90. The array substrate 90 may include a thin film transistor, a common electrode 91, and a pixel electrode 92. The pixel electrode 92 may be electrically connected to a source or a drain of the thin film transistor. For example, the thin film transistor included in the array substrate 90 may be any thin film transistor described in the above embodiments.

In the ADS-type array substrate, the common electrode 91 and the pixel electrode 92 are disposed in different layers, wherein the electrode located on an upper layer may include a plurality of strip-shaped electrodes, and the electrode located on a lower layer may include a plurality of plate-shaped electrodes. Optionally, as shown in FIG. 9, the electrode including a plurality of strip-shaped electrodes located on an upper layer is a pixel electrode 92, and a plate-shaped electrode located on a lower layer is a common electrode 91. Of course, it is also possible that the plurality of strip-shaped electrodes on the upper layer are common electrodes, and the plate-shaped electrode on the lower layer is a pixel electrode, and the specific structure is not shown.

Figure 10:
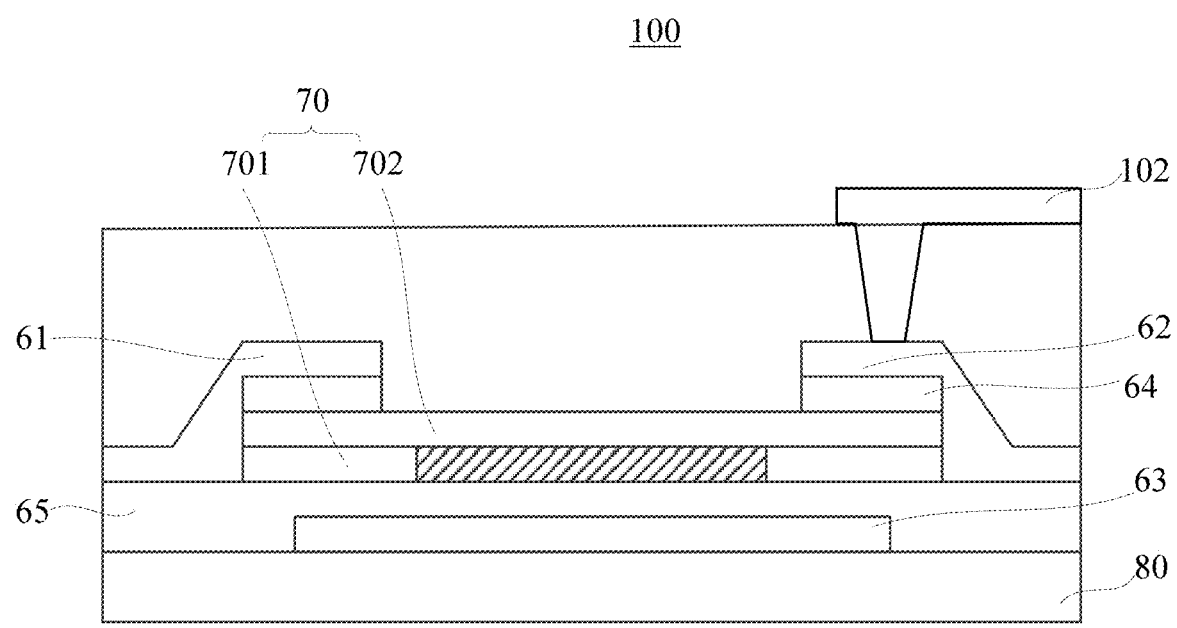
FIG. 10 is a schematic diagram of an array substrate according to another embodiment of the present disclosure.

Optionally, as shown in FIG. 10, the array substrate according to the embodiment of the present disclosure may also be a twisted nematic (TN for short) type array substrate 100. The array substrate 100 may include a thin film transistor and a pixel electrode 102. The pixel electrode 102 may be electrically connected to a source or a drain of the thin film transistor. For example, the thin film transistor included in the array substrate 100 may be any thin film transistor described in the above embodiments. The pixel electrode 102 is located on the array substrate, and the common electrode is located on the color filter substrate that is assembled with the array substrate.

It should be understood that the above is only an example of an array substrate corresponding to the thin film transistor described in the above embodiments, and it is not repeated here for other types of array substrates. For example, the thin film transistor described in the above embodiments can also be applied to an OLED array substrate. In the OLED array substrate, the drain of the thin film transistor may be electrically connected to an anode of the OLED display device.

Figure 11:
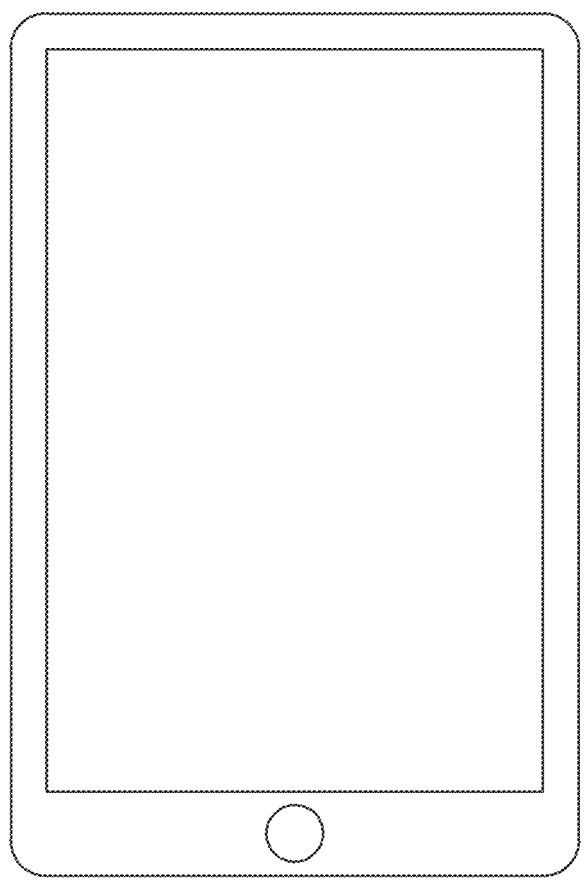
FIG. 11 is a schematic diagram of a display device according to an embodiment of the present disclosure.

Optionally, an embodiment of the present disclosure further provides a display device. The display device may include the above-mentioned array substrate, and the above-mentioned array substrate further includes any of the above-mentioned thin film transistors. The display device may include, but is not limited to, any products or components with a display function, such as electronic paper, mobile phone, tablet computer, television, display, notebook computer, digital photo frame, and navigator. It should be understood that the display device has the same beneficial effects as the thin film transistor provided by the foregoing embodiments. As shown in FIG. 11, the display device is a smartphone.

In the following, the bottom gate type thin-film transistor shown in FIGS. 6-8 and the top gate type thin-film transistor shown in FIG. 5 are taken as examples to describe in detail a specific preparation method of the thin-film transistor.

For example, the method for manufacturing a bottom gate type thin film transistor 60 as shown in FIGS. 6-8 may include a process of forming a source, a drain, and a semiconductor active layer. Forming a semiconductor active layer includes the following steps.

Figure 12A:
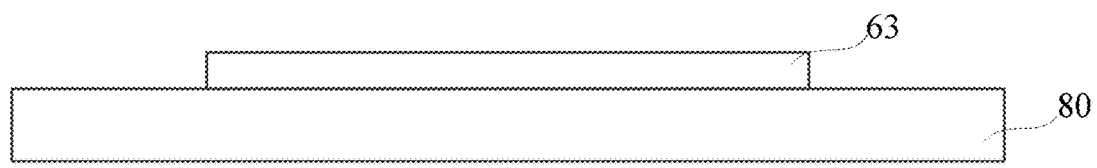
FIGS. 12A-12G are schematic diagrams respectively showing structures formed after some steps of a method for manufacturing a thin film transistor according to an embodiment of the present disclosure are performed.

In step S11, as shown in FIG. 12A, firstly forming a gate metal layer on the base substrate 80, and then patterning the gate metal layer to form a gate 63. For example, a gate metal layer may be formed on the base substrate 80 by a process such as sputtering.

Figure 12B:
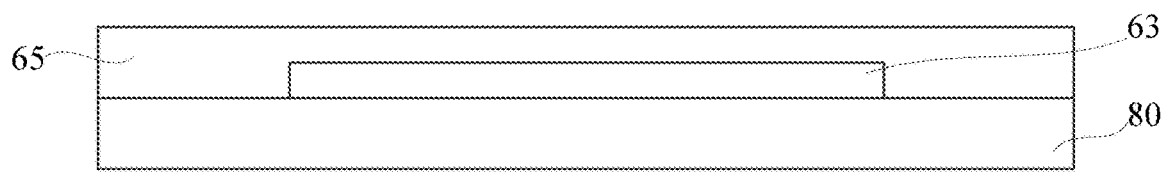

In step S12, as shown in FIG. 12B, forming a gate insulating layer 65 on the base substrate 80 on which the gate 63 is formed. For example, the gate insulating layer 65 may be formed by a plasma enhanced chemical vapor deposition method (PECVD for short).

In step S13, manufacturing a semiconductor active layer 70 on the base substrate 80 on which the gate insulating layer 65 is formed.

Specifically, step S13 can be performed according to the following steps.

Figure 12C:
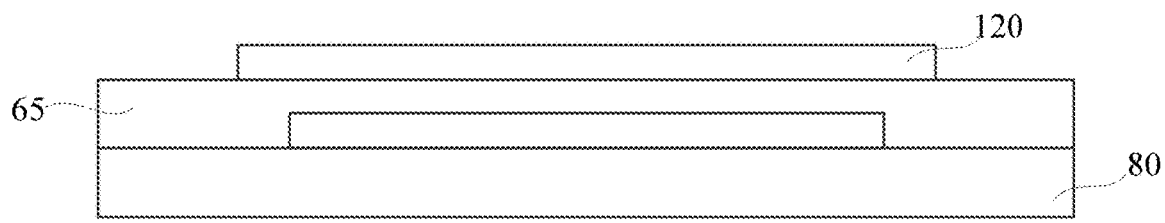

As shown in FIG. 12C, a first amorphous silicon thin film 120 is formed on a base substrate 80 on which a gate insulating layer 65 is formed.

Specifically, the first amorphous silicon thin film 120 may be formed on the base substrate 80 having the gate 63 and the gate insulating layer 65 formed thereon by a plasma enhanced chemical vapor deposition method (PECVD for short).

Figure 12D:
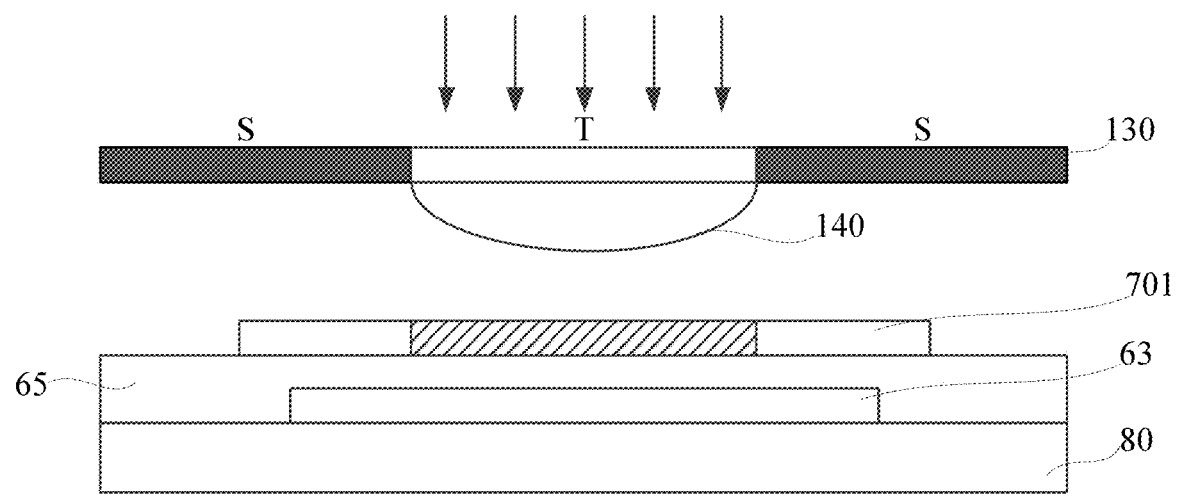

As shown in FIG. 12D, crystallizing the first amorphous silicon thin film 120 to form a first sub-semiconductor layer 701, the first sub-semiconductor layer 701 may include an amorphous silicon layer 7011 having a polysilicon portion 7012.

Optionally, the crystallization treatment may include a laser crystallization treatment process, a thermal annealing process, or a solid-phase crystallization treatment process. For example, a selective annealing process may be used to partially anneal the first amorphous silicon film 120. Specifics of the selective annealing process is shown in FIG. 12D. The laser light emitted by the laser emitter is irradiated to the mask plate 130 on the side of the first amorphous silicon film 120 facing away from the base substrate 80, and the laser light is then irradiated to the lens 140 located between the mask plate 130 and the first amorphous silicon thin film 120 and corresponding in position to the transmission region T of the mask plate 130. The lens 140 has a certain converging effect on the light, which may increase the intensity of the laser light, so that under the converging effect of the lens 140, the first amorphous silicon thin film 120 is irradiated with the laser light at a position corresponding to the transmission region T of the mask plate 130 and such that an annealing process is performed so that a portion of the first amorphous silicon thin film 120 at a position corresponding to the transparent region T of the mask plate 130 is changed from amorphous silicon to polysilicon, and a polysilicon portion 7012 is formed. In addition, the laser light cannot pass through the shielding area S of the mask plate 130, and therefore, a portion of the first amorphous silicon thin film 120 at a position corresponding to the shielding area S of the mask plate 130 is not irradiated with the laser light.

Figure 12E:
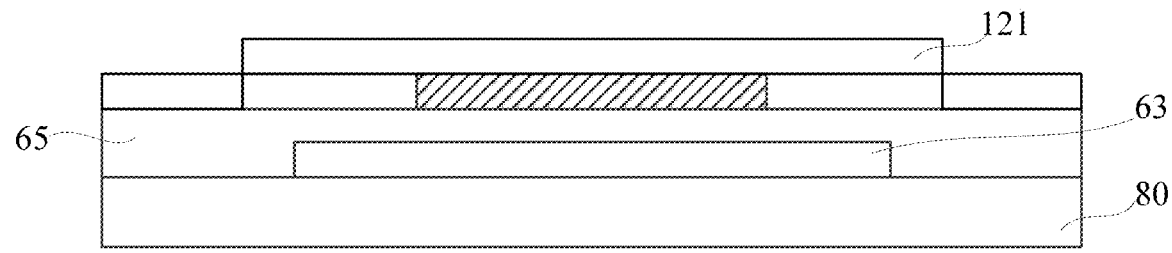
Figure 12F:
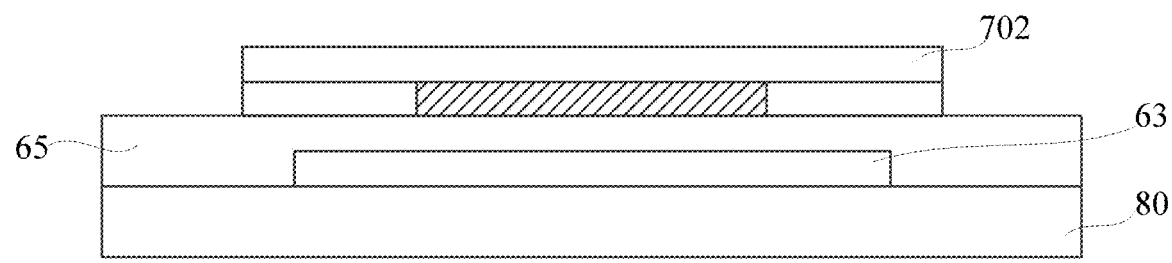

Next, as shown in FIGS. 12E and 12F, manufacturing a second sub-semiconductor layer 702 on the base substrate 80 on which the first sub-semiconductor layer 701 is formed. For example, a second amorphous silicon thin film 121 may be formed on the base substrate 80 on which the first sub-semiconductor layer 701 is formed using a PECVD process, and then the second amorphous silicon thin film 121 is patterned to form a second sub-semiconductor layer 702.

Figure 12G:
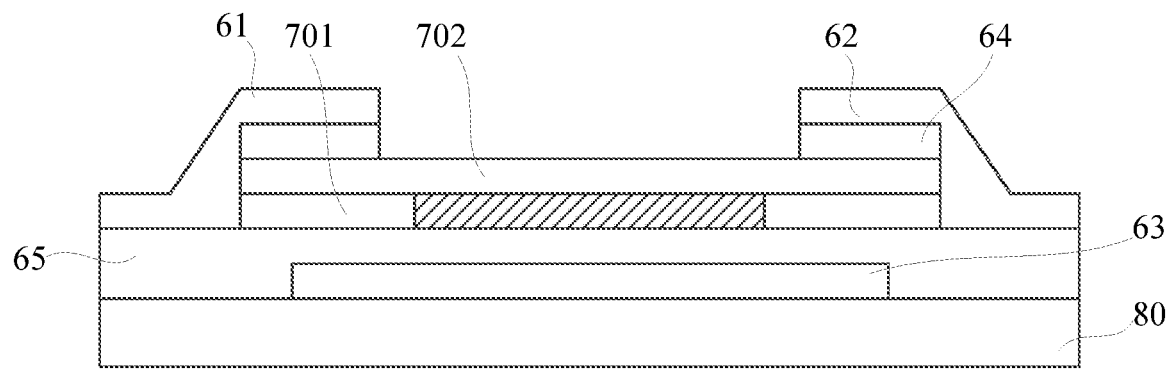

Then, as shown in FIG. 12G, forming an ohmic contact layer 64, a source 61, and a drain 62 on the base substrate 80 on which the second sub-semiconductor layer 702 is formed. For example, an ion-doped amorphous silicon film and a source/drain metal layer may be formed on the base substrate 80 on which the second sub-semiconductor layer 702 is formed, respectively, and then the ion-doped amorphous silicon film and the source/drain metal layer are processed by one patterning process to form the ohmic contact layer 64, the source 61 and the drain 62.

Since the orthographic projection of the second sub-semiconductor layer 702 on the base substrate covers the orthographic projection of the first sub-semiconductor layer 701 on the base substrate, in the subsequent patterning process, the second sub-semiconductor layer 702 may protect the first sub-semiconductor layer 701, for example, may protect the first sub-semiconductor layer 701 from being affected by a subsequent etching process.

For example, the method for manufacturing a top gate type thin film transistor as shown in FIG. 5 may include the following steps.

Figure 13A:
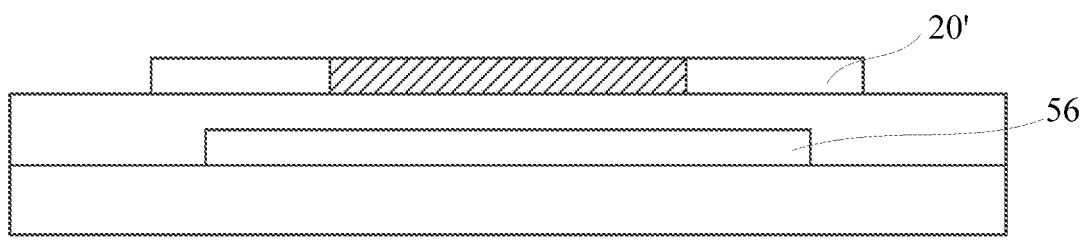
FIGS. 13A-13C are schematic diagrams respectively showing structures formed after some steps of a method for manufacturing a thin film transistor according to another embodiment of the present disclosure are performed.

In step S21, as shown in FIG. 13A, manufacturing a semiconductor active layer 20' on the base substrate on which the light shielding layer 56 is formed.

Figure 13B:
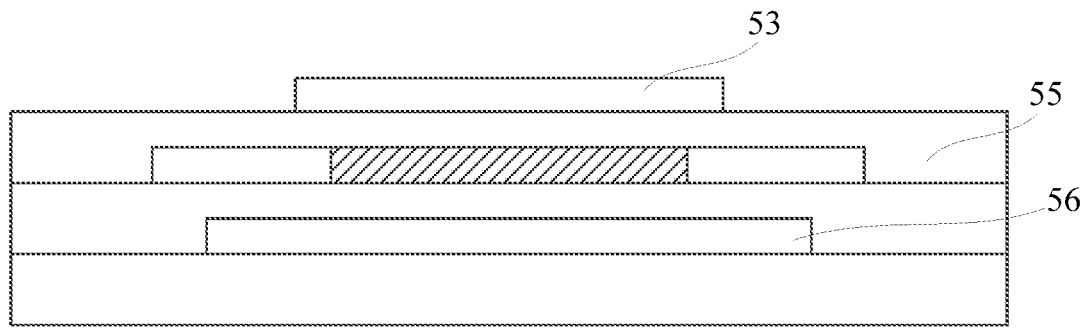

In step S22, as shown in FIG. 13B, a gate insulating layer 55 and a gate metal layer are respectively formed on the base substrate on which the semiconductor active layer 20' is formed, and then patterning the gate metal layer to form the gate 53.

Figure 13C:
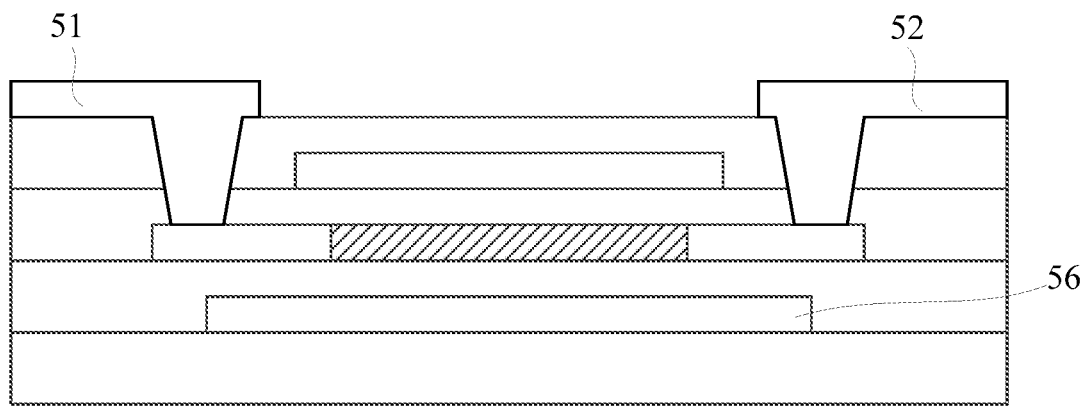

In step S23, as shown in FIG. 13C, forming a passivation layer and a source/drain metal layer on the base substrate on which the gate 53 is formed. For example, the passivation layer and the source/drain metal layer are processed by one patterning process to form the source 51 and the drain 52, respectively.

Specifically, step S21 may be performed according to the following steps.

Figure 14A:
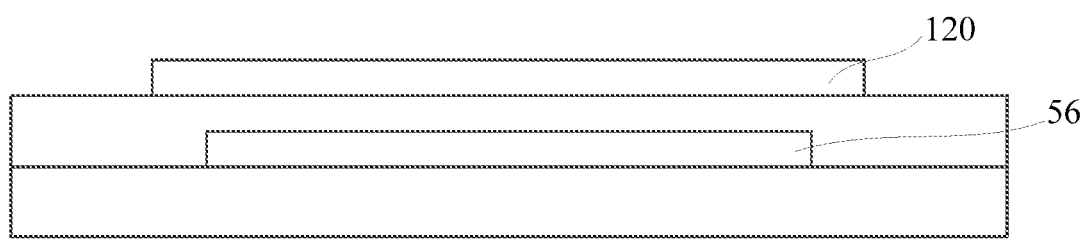
FIGS. 14A-14B are schematic diagrams respectively showing structures formed after a step of forming a semiconductor active layer in the method for manufacturing a thin film transistor according to an embodiment of the present disclosure is performed.

As shown in FIG. 14A, forming a first amorphous silicon thin film 120 on a base substrate on which a light shielding layer 56 is formed.

Specifically, the first amorphous silicon thin film 120 may be formed by a plasma enhanced chemical vapor deposition method (PECVD for short).

Figure 14B:
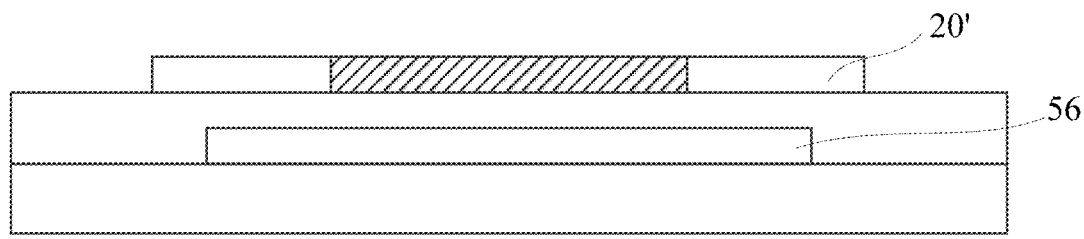

As shown in FIG. 14B, crystallizing the first amorphous silicon thin film 120 to form a semiconductor active layer 20'. The semiconductor active layer 20' may include an amorphous silicon layer having a polysilicon portion. For example, a selective annealing (Selective Laser Annealing) process may be used to partially anneal the first amorphous silicon thin film 120 to form a semiconductor active layer 20', which may be referred to the steps for forming the first sub-semiconductor layer 701 described above for details, and are not repeated here.

It should be noted that the top gate type thin-film transistor and the bottom gate type thin-film crystal differ only in the formation order of the respective layers, and the methods for manufacturing respective layers are the same or similar, and are not repeated here.

It should also be noted here that the patterning in the embodiments of the present disclosure may include a photolithography process, or include a photolithography process and an etching step, and may also include other processes for forming a predetermined pattern such as printing, and inkjet. The photolithography process refers to a process of forming a pattern using a photoresist, a mask, an exposure machine and the like, which are included in the processes such as film formation, exposure, and development.

Although some embodiments of the present disclosure which reflect the general inventive concept have been illustrated and described, those skilled in the art will understand that modifications may be made to these embodiments without departing from the principles and spirit of the general concept of the present disclosure. The protective scope of the present disclosure is defined by the claims and their equivalents.

What is claimed is:

1. A thin film transistor formed on a base substrate, the thin film transistor comprising:
   a source;
   a drain; and
   a semiconductor active layer having an amorphous silicon layer and a plurality of polysilicon portions, the amorphous silicon layer being in contact with the plurality of polysilicon portions;
      wherein the plurality of polysilicon portions are strip-shaped structures, which extend in a direction toward the source and the drain and which are alternately distributed; and
      wherein there is no overlapping area between orthographic projections of the source and the drain on the base substrate and orthographic projections of the plurality of polysilicon portions on the base substrate.

2. The thin film transistor according to claim 1, wherein the plurality of polysilicon portions in stripe-shaped structures are arranged to be parallel to each other.

3. The thin film transistor according to claim 2, wherein the plurality of polysilicon portions in stripe-shaped structures are arranged to have a same length, and both ends of the plurality of poly silicon portions are aligned with each other respectively.

4. The thin film transistor according to claim 3, wherein the plurality of polysilicon portions in stripe-shaped structures are oblong or rectangular with a same shape.

5. The thin film transistor according to claim 1, wherein the number of the plurality of polysilicon portions is at least three.

6. The thin film transistor according to claim 1, wherein the amorphous silicon layer comprises a plurality of hollow portions, and the plurality of polysilicon portions respectively fill the plurality of hollow portions to form a first sub-semiconductor layer.

7. The thin film transistor according to claim 6, wherein the semiconductor active layer further comprises a second sub-semiconductor layer formed of another amorphous silicon layer, and the second sub-semiconductor layer is disposed on the first sub-semiconductor layer and is arranged to cover the first sub-semiconductor layer, and the source and the drain are connected to the second sub-semiconductor layer.

8. The thin film transistor according to claim 1, wherein an ohmic contact layer is disposed between the source and the amorphous silicon layer, and the ohmic contact layer is disposed between the drain and the amorphous silicon layer.

9. The thin film transistor according to claim 1, wherein the thin film transistor is a bottom gate type thin film transistor or a top gate type thin film transistor.

10. An array substrate comprising:
    a base substrate; and
    a plurality of thin film transistors, wherein at least one thin film transistor of the plurality of thin film transistors is the thin film transistor according to claim 1.

11. A display device comprising an array substrate, wherein the array substrate comprises: a base substrate; and a plurality of thin film transistors, wherein at least one thin film transistor of the plurality of thin film transistors is the thin film transistor according to claim 1.

12. A method for manufacturing a thin film transistor, the method comprising a process of forming a source, a drain, and a semiconductor active layer, wherein forming the semiconductor active layer comprises:
    forming a first amorphous silicon thin film on a base substrate; and
    performing a crystallization treatment to the first amorphous silicon thin film to convert a part of amorphous silicon in the first amorphous silicon thin film into polysilicon, such that a semiconductor active layer comprising a plurality of polysilicon portions are formed;
    wherein the method further comprises configuring shapes of the plurality of polysilicon portions into stripe-like structures extending in a direction toward the source and the drain; and
    wherein the method further comprises arranging the plurality of polysilicon portions in stripe-shaped structures to be in parallel to each other and to be spaced apart from each other; and
    wherein there is no oveda ina area between orthographic projections of the source and the drain on the base substrate and orthographic projections of the plurality of polysilicon portions on the base substrate.

13. The method according to claim 12, wherein forming the semiconductor active layer with the plurality of polysilicon portions further comprises:
    forming a second amorphous silicon thin film on the first amorphous silicon thin film; and
    performing a patterning process on the second amorphous silicon thin film to form a second sub-semiconductor layer,
    wherein an orthographic projection of the second sub-semiconductor layer on the base substrate covers an orthographic projection of the plurality of polysilicon portions on the base substrate.

14. The method according to claim 12, wherein the semiconductor active layer comprises the plurality of polysilicon portions, and the method further comprises arranging the plurality of polysilicon portions in stripe-shaped structures to have a same length, and arranging both ends of the plurality of polysilicon portions to be aligned with each other respectively.

* * * * *